United States Patent
Chong et al.

(10) Patent No.: US 9,933,643 B2
(45) Date of Patent: Apr. 3, 2018

(54) CURVED DISPLAY DEVICE WITH PREDIETEMINED CURVATURE ALONG TWO DIRECTIONS

(71) Applicant: Samsung Display Co. Ltd., Yongin-si (KR)

(72) Inventors: Jong Ho Chong, Hwaseong-si (KR); Su Young Kim, Seoul (KR); Eun Jung Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/230,149

(22) Filed: Aug. 5, 2016

(65) Prior Publication Data

US 2017/0227805 A1 Aug. 10, 2017

(30) Foreign Application Priority Data

Feb. 5, 2016 (KR) .................. 10-2016-0015125

(51) Int. Cl.
| | |
|---|---|
| *H01L 27/12* | (2006.01) |
| *H01L 27/32* | (2006.01) |
| *G02F 1/1333* | (2006.01) |
| *G02F 1/1362* | (2006.01) |
| *G02F 1/1343* | (2006.01) |
| *G02F 1/1368* | (2006.01) |

(52) U.S. Cl.
CPC .. *G02F 1/133305* (2013.01); *G02F 1/134309* (2013.01); *G02F 1/136286* (2013.01); *H01L 27/124* (2013.01); *G02F 1/1368* (2013.01); *G02F 2001/134345* (2013.01); *G02F 2201/121* (2013.01); *G02F 2201/123* (2013.01); *G02F 2201/56* (2013.01); *H01L 27/3262* (2013.01); *H01L 2251/5338* (2013.01)

(58) Field of Classification Search
CPC ............... H01L 27/124; H01L 27/3262; H01L 2251/5338
See application file for complete search history.

(56) References Cited

U.S. PATENT DOCUMENTS

| | | |
|---|---|---|
| 2015/0036077 A1 | 2/2015 | Lee et al. |
| 2015/0085220 A1 | 3/2015 | Chen et al. |
| 2015/0098174 A1 | 4/2015 | Song et al. |
| 2015/0370121 A1 | 12/2015 | Wu et al. |
| 2016/0109763 A1* | 4/2016 | Seo .................... G02F 1/134336 257/72 |

(Continued)

FOREIGN PATENT DOCUMENTS

| | | |
|---|---|---|
| CN | 104391410 | 3/2015 |
| KR | 1020100007227 | 1/2010 |
| KR | 1020110130177 | 12/2011 |

OTHER PUBLICATIONS

Extended European Search Report—European patent application No. 16189288.0 dated Mar. 9, 2017, citing reference listed within.

*Primary Examiner* — Thanh V Pham
(74) *Attorney, Agent, or Firm* — Cantor Colburn LLP

(57) ABSTRACT

A curved display device comprising a display panel having a display surface on which a plurality of pixel units are disposed. The display surface includes a first bending line, which extends in a first direction, and a second bending line, which extends in a second direction that crosses the first direction at a right angle, and is bent along each of the first bending line and the second bending line.

20 Claims, 14 Drawing Sheets

(56) References Cited

U.S. PATENT DOCUMENTS

| | | | |
|---|---|---|---|
| 2016/0202579 A1* | 7/2016 | Kim | G02F 1/136209 |
| | | | 349/44 |
| 2016/0223857 A1* | 8/2016 | Im | G02F 1/133514 |
| 2016/0227623 A1* | 8/2016 | Yoo | H05B 33/145 |
| 2016/0238908 A1* | 8/2016 | Kim | G02F 1/134336 |
| 2016/0253970 A1* | 9/2016 | Chen | G02F 1/1333 |
| | | | 345/214 |
| 2016/0274409 A1* | 9/2016 | Kang | G02F 1/133512 |

\* cited by examiner

CURVED DISPLAY DEVICE WITH PREDIETEMINED CURVATURE ALONG TWO DIRECTIONS

This application claims priority to Korean Patent Application No. 10-2016-0015125, filed on Feb. 5, 2016, and all the benefits accruing therefrom under 35 U.S.C. 119, the content of which in its entirety is herein incorporated by reference.

BACKGROUND

1. Field

The disclosure relates to a curved display device.

2. Description of the Related Art

The importance of display devices has steadily grown with recent developments in multimedia technology. As a result, a variety of display devices such as a liquid crystal display ("LCD") device, an organic light-emitting diode ("OLED") display device, and the like have been developed and widely used.

Flat panel display ("FPD") devices have been developed to replace cathode ray tube ("CRT") display devices that are thick and consume a substantial amount of power. However, FPD devices, in which a display screen is flat, may cause deviations in the distance from the display screen to a viewing zone.

Recently, the demand for display devices capable of providing a three-dimensional ("3D") effect and a sense of involvement for a viewer has increased.

SUMMARY

Exemplary embodiments of the disclosure provide a curved display device with improved sense of involvement for a viewer who views a display surface thereof by bending the left and right sides and the upper and lower sides of the display surface to a predetermined curvature.

However, exemplary embodiments of the disclosure are not restricted to those set forth herein. The above and other exemplary embodiments of the disclosure will become more apparent to one of ordinary skill in the art to which the disclosure pertains by referencing the detailed description below.

An exemplary embodiment of the invention discloses a curved display device, comprising: a display panel including a plurality of pixel units, where a display surface on which a plurality of pixel units are disposed, is defined on the display panel. In such an embodiment, a first bending line, which extends in a first direction, and a second bending line, which extends in a second direction that crosses the first direction at a right angle, are defined on the display surface, and the display surface is bent along each of the first and second bending lines.

In an exemplary embodiment of the invention, a curved display device incudes: a display panel including a plurality of pixels, where a display surface, which includes a central area and a peripheral area disposed outside the central area, is defined on the display panel; a plurality of gate lines disposed on the display surface to extend in a first direction; and a plurality of data lines disposed on the display surface to extend in a second direction which crosses the first direction at a right angle. In such an embodiment, the pixel units are connected to the gate lines and the data lines; and a first bending line, which extends in the first direction, and a second bending line, which extends in the second direction, are defined on the display surface, and the display surface is bent along each of the first and second bending lines.

According to exemplary embodiments set forth herein, a sense of involvement may be improved for a viewer who views a display surface by bending four sides of the display surface along first and second bending lines.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION

Figure 1:
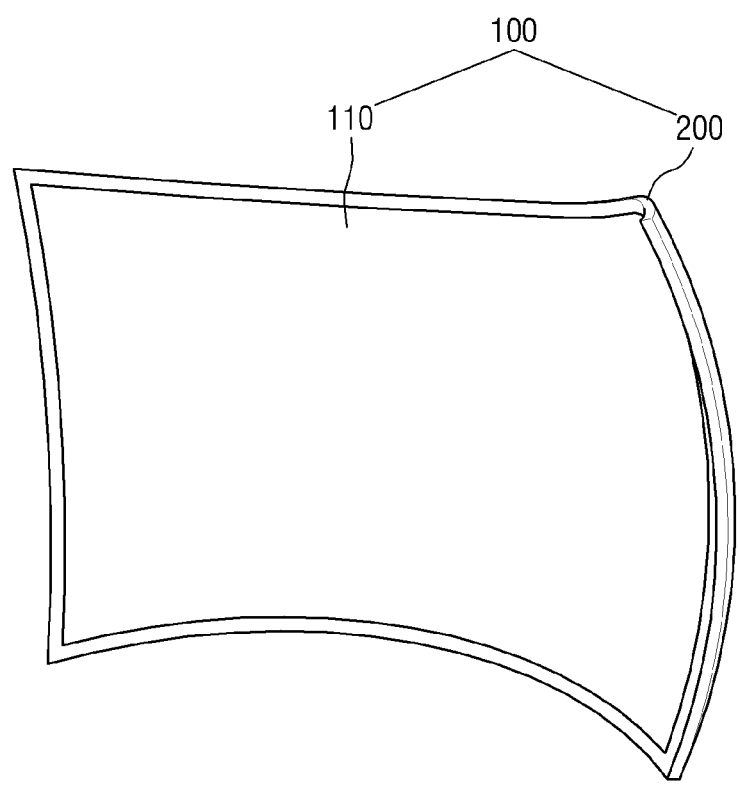
FIG. 1 is a schematic perspective view of a curved display device according to an exemplary embodiment of the disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a schematic perspective view of a curved display device according to an exemplary embodiment of the disclosure.

Referring to FIG. 1, an exemplary embodiment of a curved display device may include a display panel 100, which has a display surface 110 defined thereon, and a bezel area 200 surrounding the display surface 110. The display surface 110 of the display panel 100 may display an image or image information. The bezel area 200 may be defined as an area in which no image is displayed. In such an embodiment, the bezel area 200 may be disposed outside the display surface 110 and may protect elements in the curved display device.

Four sides of the display panel 100 may be bent to face the front of the display surface 110. In an exemplary embodiment, the four sides of the display panel 100 may be bent to protrude toward the front of the display surface 110, compared to a center portion of the display surface 110. In such an embodiment, the display surface 110 and a rear surface of the display panel 100 may both be bent with a predetermined curvature, thereby forming a curved shape.

Figure 2:
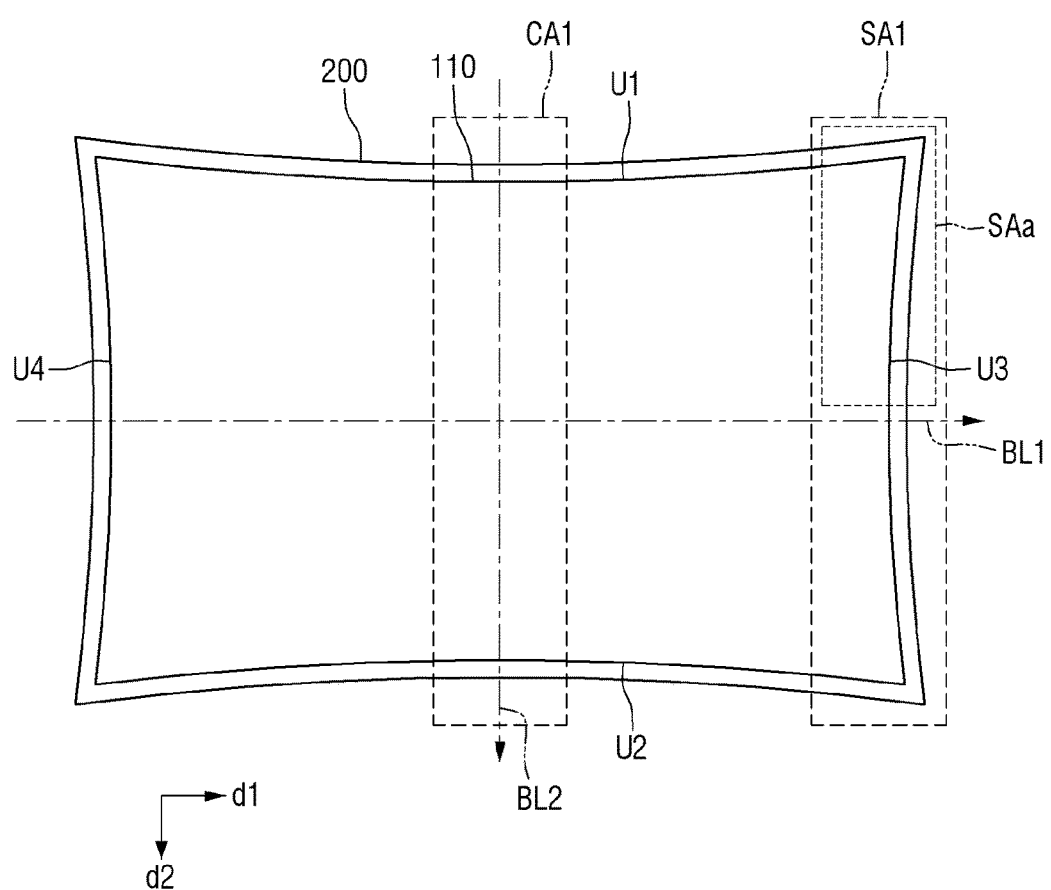
FIG. 2 is a schematic view illustrating the planar shape of an exemplary embodiment of the curved display device of FIG. 1.

FIG. 2 is a schematic view illustrating the planar shape of an exemplary embodiment of the curved display device of FIG. 1.

Referring to FIG. 2, in an exemplary embodiment, a first bending line BL1, which extends in a first direction d1, and a second bending line BL2, which extends in a second direction d2, are defined on the display surface 110 when viewed in a plan view. The first and second bending lines BL1 and BL2 may be imaginary lines. The first and second bending lines BL1 and BL2 may cross each other at a right angle or about 90 degrees. In an exemplary embodiment, the display panel 100 may include a plurality of pixel units (not illustrated) disposed on the display surface 110 in a matrix form. In such an embodiment, as shown in FIG. 2, the first direction d1 may be a horizontal direction or a row direction of the pixel units, and the second direction d2 may be a vertical direction or a column direction of the pixel units.

In an exemplary embodiment, the first bending line BL1 may pass through the middle of a first outer side U1 and the middle of a second outer side U2, which is opposite to the first outer side U1. The second bending line BL2 may pass through the middle of a third outer side U3 and the middle of a fourth outer side U4, which is opposite to the third outer side U3. However, the first and second bending lines BL1 and BL2 are exemplary, and the locations of the first and second bending lines BL1 and BL2 may vary depending on the size and the structure of the display panel 100.

In an exemplary embodiment, the display surface 110 may be bent along both the first and second bending lines BL1 and BL2. Accordingly, the four sides of the display surface 110 may not only protrude toward the front of the display surface 110, but may also be bent toward the intersection between the first and second bending lines BL1 and BL2. Alternatively, the four sides of the display surface 110 may be bent in directions in which the first and second bending lines BL1 and BL2 are bent. Accordingly, the sense of involvement of a viewer who views the display surface 110 may be improved.

The display surface 110 may include the first through fourth outer sides U1 through U4. The display surface 110 may have reflection symmetry with respect to the first bending line BL1 and the second bending line BL2. The first outer side U1 may be symmetric or formed to be inverted upside down with the second outer side U2 with respect to the first bending line BL1. The third outer side U3 may be symmetric with or formed to be inverted left side right with the fourth outer side U4 with respect to the second bending line BL2. At least one of the first through fourth outer sides U1 through U4 may be parabolic in a plan view. In such an embodiment, at least one of the first through fourth outer sides U1 through U4 may be concave toward the intersection between the first and second bending lines BL1 and BL2.

The curvature (e.g., the radius of curvature) of the first outer side U1 may be the same as the curvature of the second outer side U2, but may not be the same as the curvature of the third or fourth outer side U3 or U4. The curvature of each of the first through fourth outer sides U1 through U4 may vary depending on the size, e.g., the length and the height, of the display surface 110.

The display surface includes a central area CA1, in which the intersection between the first and second bending lines BL1 and BL2 is disposed, and a peripheral area SA1, which is disposed outside the central area CA1. For convenience of description, only part of the peripheral area SA1 that is adjacent to the third outer side U3 will hereinafter be described in detail.

The display panel 100 may include a plurality of pixel units (not illustrated), which are disposed on the display surface 110. The structure and the arrangement of the pixel units will be described later in detail.

Figure 3:
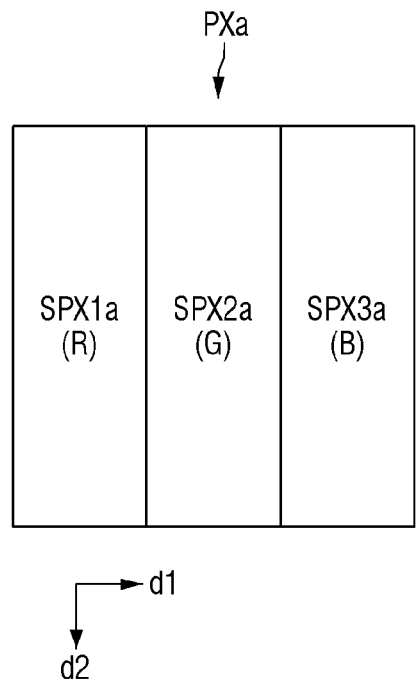
FIG. 3 is a schematic view illustrating the structure of an exemplary embodiment of a pixel unit of the curved display device of FIG. 1.
Figure 4:
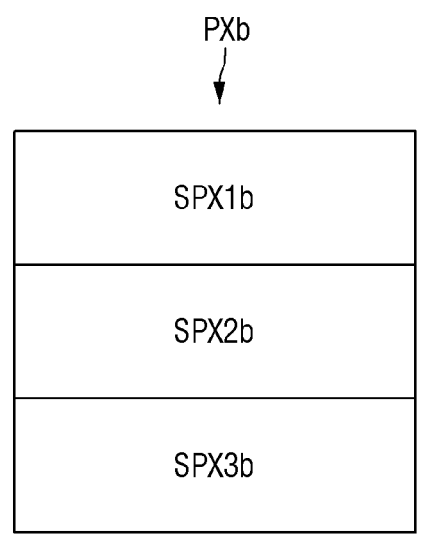
FIG. 4 is a schematic view illustrating of the structure of an alternative exemplary embodiment of a pixel unit of the curved display device of FIG. 1.
Figure 4:
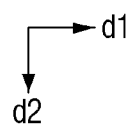

FIG. 3 is a schematic view illustrating the structure of an exemplary embodiment of a pixel unit of the curved display device of FIG. 1. FIG. 4 is a schematic view illustrating the structure of an alternative exemplary embodiment of a pixel unit of the curved display device of FIG. 1.

In an exemplary embodiment, as shown in FIG. 3, the pixel unit PXa may include first through third sub-pixel units SPX1a through SPX3a, which are arranged in the first direction d1. The first through third sub-pixel units SPX1a through SPX3a may display different colors. In an exemplary embodiment, the first through third sub-pixel units SPX1a through SPX3a may display red, green, and blue colors, respectively. In an alternative exemplary embodiment, the first through third sub-pixel units SPX1a through SPX3a may display magenta, cyan, and yellow colors, respectively. Although not specifically illustrated, an exemplary embodiment of the pixel unit PXa shown in FIG. 3 may further include a fourth sub-pixel unit (not illustrated), which is disposed adjacent to the third sub-pixel unit SPX3a in the first direction d1. In an exemplary embodiment, the fourth sub-pixel unit may display a white color.

In an alternative exemplary embodiment, as shown in FIG. 4, the pixel unit PXb may include first through third sub-pixel units SPX1b through SPX3b, which are arranged in the second direction d2. In such an embodiment, the sub-pixel units of the pixel unit PXb display different colors. The first through third sub-pixel units SPX1b through SPX3b of FIG. 4 may be substantially the same as the first through third sub-pixel units SPX1a through SPX3a of FIG. 3 except for the direction in which the sub-pixels are arranged in the pixel unit, and any repetitive detailed descriptions thereof will hereinafter be omitted for convenience of description.

Figure 5:
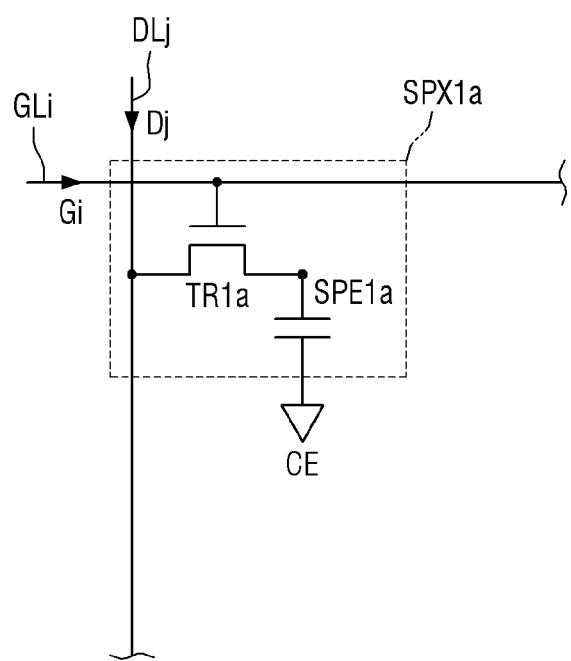
FIG. 5 is an equivalent circuit diagram of an exemplary embodiment of the pixel unit of FIG. 3.

FIG. 5 is an equivalent circuit diagram of an exemplary embodiment of the pixel unit of FIG. 3. More specifically, FIG. 5 is a schematic equivalent circuit diagram of an exemplary embodiment of the first sub-pixel unit SPX1a of the pixel unit PXa arranged in the first direction d1.

Referring to FIG. 5, in an exemplary embodiment, the first sub-pixel unit SPX1a may include a first sub-pixel electrode SPE1a and a first switching device TR1a, which is connected to the first sub-pixel electrode SPE1a. In an exemplary embodiment, the first switching device TR1a may be a three-terminal device such as a thin-film transistor ("TFT"), for example.

A gate electrode of the first switching device TR1a may be connected to an i-th gate line GLi, and a first electrode, for example, a source electrode, of the first switching device TR1a may be connected to a j-th data line DLj. A second electrode, for example, a drain electrode, of the first switching device TR1a may be connected to the first sub-pixel electrode SPE1a. Accordingly, the first switching device TR1a may be turned on by an i-th gate signal provided thereto from the i-th gate line GLi via the control electrode, and may provide a j-th data signal Dj provided thereto from the j-th data line DLj via the source electrode to the first sub-pixel electrode SPE1a via the drain electrode.

The first sub-pixel unit SPX1a may include a first liquid crystal capacitor Clc1, which is formed between or defined by the first sub-pixel electrode SPE1a and a common electrode CE. In an exemplary embodiment, a fringe field is generated according to the j-th data signal Dj provided to the first sub-pixel electrode SPE1a and a common voltage applied to the common electrode CE, and the alignment of liquid crystal molecules between the first sub-pixel electrode SPE1a and the common electrode CE may be controlled by the fringe field. In an exemplary embodiment, the curved display device may be a curved liquid crystal display ("LCD") device including the first sub-pixel unit SPX1a of FIG. 5.

Figure 6:
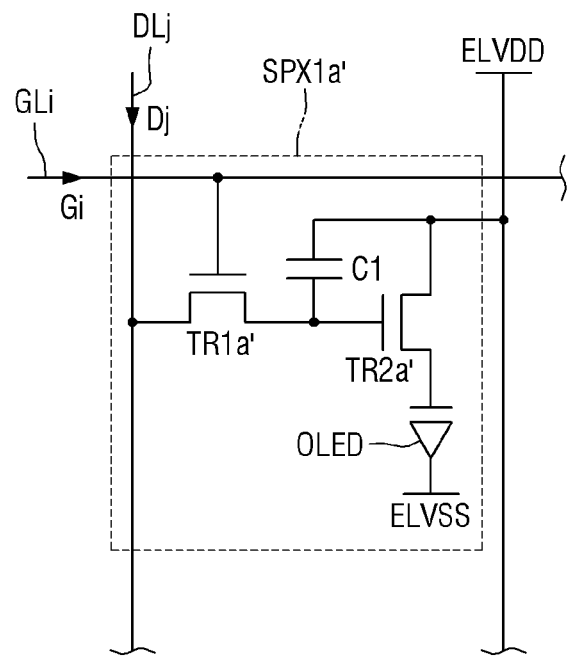
FIG. 6 is an equivalent circuit diagram of an alternative exemplary embodiment of the pixel unit of FIG. 3.

FIG. 6 is an equivalent circuit diagram of an alternative exemplary embodiment of the pixel unit of FIG. 3. More specifically, FIG. 6 is a schematic equivalent circuit diagram of an exemplary embodiment of the first sub-pixel unit SPX1a of the pixel unit PXa arranged in the second direction d2. For a distinction from the first sub-pixel unit SPX1a of FIG. 5, the first sub-pixel unit of FIG. 6 will hereinafter be referred to as the first sub-pixel unit SPX1a'.

Referring to FIG. 6, in an exemplary embodiment, the first sub-pixel unit SPX1a' may include a first switching device TR1a', a second switching device TR2a', an organic light-emitting diode OLED, and a first storage capacitor C1.

A gate electrode of the first switching device TR1a' may be connected to an i-th gate line GLi, a first electrode of the first switching device TR1a' may be connected to a j-th data line DLj, and a second electrode of the first switching device TR1a' may be connected to a gate electrode of the second switching device TR2a'. The first switching device TR1a' may be turned on by an i-th gate signal Gi provided thereto from the i-th gate line GLi and may apply a j-th data signal Dj provided thereto from the j-th data line DLj to a first electrode of the first storage capacitor C1. That is, the first switching device TR1a' may be a switching transistor.

A gate electrode of the second switching device TR2a' may be connected to the first switching device TR1a', and a first electrode of the second switching device TR2a' may be connected to a driving voltage source ELVDD. A second electrode of the second switching device TR2a' may be connected to a first electrode of the organic light-emitting diode OLED. A second electrode of the organic light-emitting diode OLED may be connected to a ground source ELVSS. Accordingly, the second switching device TR2a' may control the amount of driving current provided to the organic light-emitting diode OLED according to a voltage that the first storage capacitor C1 is charged with. That is, the second switching device TR2a' may be a driving transistor.

In an exemplary embodiment, the curved display device may be a curved organic light-emitting diode device including the first sub-pixel unit SPX1a' of FIG. 6.

Figure 7:
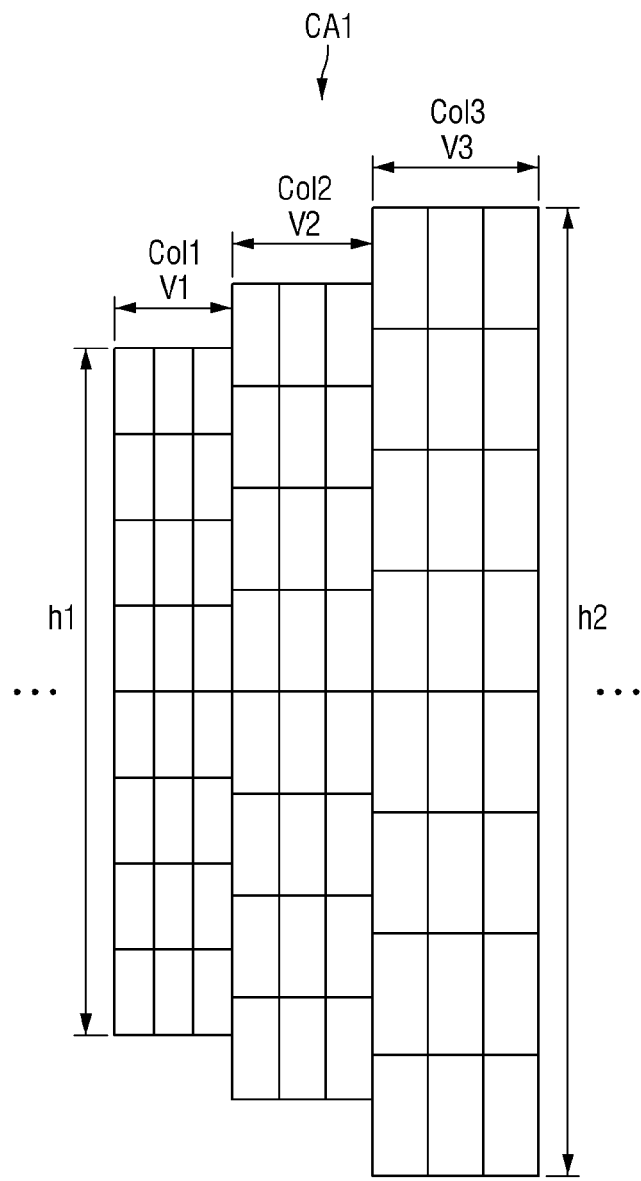
FIG. 7 is a schematic view illustrating an exemplary embodiment of a plurality of pixel units that form the planar shape of the curved display device of FIG. 2.
Figure 8:
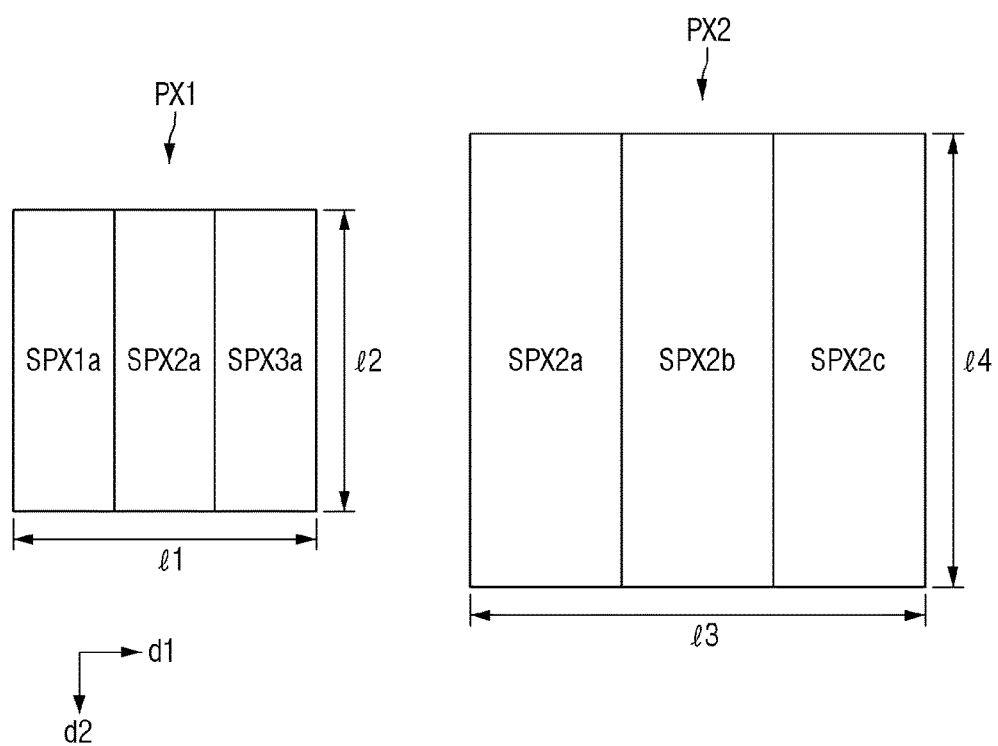
FIG. 8 is a schematic view showing the sizes of the pixel units in a central area and a peripheral area, respectively, of the planar shape of the curved display device of FIG. 7.

FIG. 7 is a schematic view illustrating an exemplary embodiment of a plurality of pixel units that form the planar shape of the curved display device of FIG. 2. FIG. 8 is a schematic view showing the sizes of the pixel units in a central area and a peripheral area of the planar shape of the curved display device of FIG. 7. Hereinafter, for convenience of description, an exemplary embodiment, where each pixel unit includes three sub-pixel units, will be described in detail.

The arrangement of the pixel units in a central area CA1 will hereinafter be described with reference to FIG. 7. In an exemplary embodiment, the numbers of the pixel units included in first through third columns col1 through col3, respectively, may all be identical to each other, but the sizes of the pixel units included in first through third columns col1 through col3, respectively, may differ from one another.

In an exemplary embodiment, the number of the pixel units included in each column may be uniform, but the size of the pixel units may differ from one column to another column. The term "size of a pixel unit", as used herein, includes, but is not limited to, both the horizontal and vertical lengths of the pixel unit. In an exemplary embodiment, the size of a pixel unit may include one of the horizontal and vertical lengths of the pixel unit. A horizontal length v1 (e.g., the length in the first direction d1) of the pixel units included in the first column col1 may be smaller than a horizontal length v2 of the pixel units included in the second column col2, and the horizontal length v2 of the pixel units included in the second column col2 may be smaller than a horizontal length v3 of the pixel units included in the third column col3. A vertical length h1 of the first column may be smaller than a vertical length h2 of the third column col3.

Referring to FIG. 8, a first pixel unit PX1 may be a pixel unit disposed in a particular column in the central area CA1, and a second pixel unit PX2 may be a pixel unit disposed in a particular column in the peripheral area SA1. A horizontal length l1 of the first pixel unit PX1 may be smaller than a horizontal length l3 of the second pixel unit PX2, and a vertical length l2 of the first pixel unit PX1 may be smaller than a vertical length l4 of the second pixel unit PX2. In an exemplary embodiment, in the case of a full high-definition ("HD") configuration having 1080 pixel units, the horizontal and vertical lengths l1 and l2 of the first pixel unit PX1 may be about 311 micrometers (μm), and the horizontal and vertical lengths l3 and L4 of the second pixel unit PX2 may be about 400 μm. In such an embodiment, the size of the second pixel unit PX2 may be about 1.3 times larger than the size of the first pixel unit PX1, but not being limited thereto. In an exemplary embodiment, the relative size of the second pixel unit PX2 to the first pixel unit PX1 may vary depending on the curvature of the first outer side U1. The curvature of the first outer side U1 may vary depending on the size of the display panel 100.

In an exemplary embodiment, at least one of the horizontal and vertical lengths of each pixel unit may gradually increase from the central area CA1 to the peripheral area SA1 along the first direction d1 according to the radius of curvature of the first outer side U1. Accordingly, such an embodiment of the display surface 110 shown in FIG. 2 may be realized by providing the same number of the pixel units in each column, but varying the size of each pixel unit from one column to another column.

Figure 9:
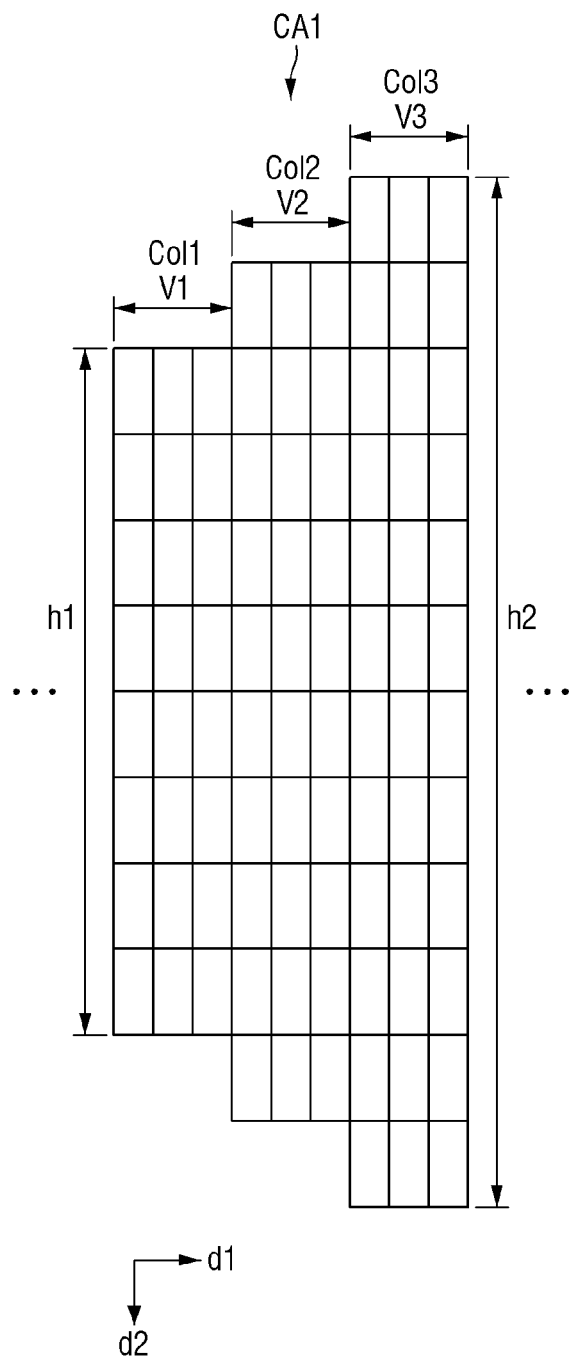
FIG. 9 is a schematic view illustrating an alternative exemplary embodiment of the plurality of pixel units that form the planar shape of the curved display device of FIG. 2.
Figure 10:
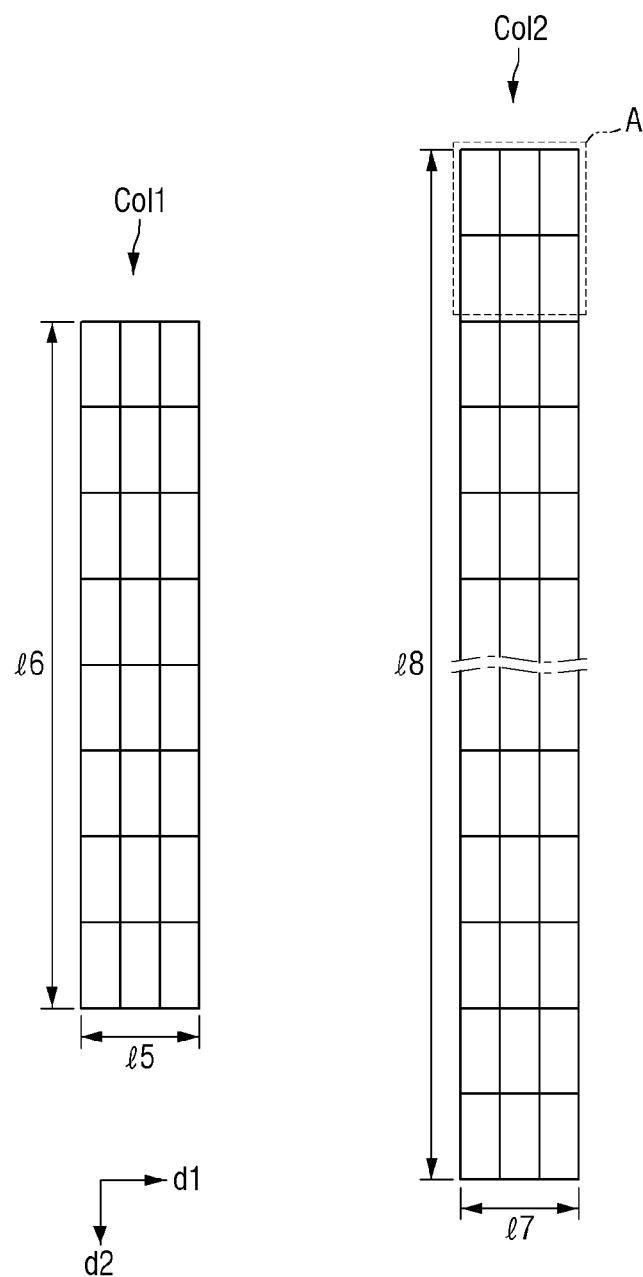
FIG. 10 is a schematic view showing the numbers of the pixel units in a central area and a peripheral area, respectively, of the planar shape of the curved display device of FIG. 9.
Figure 11:
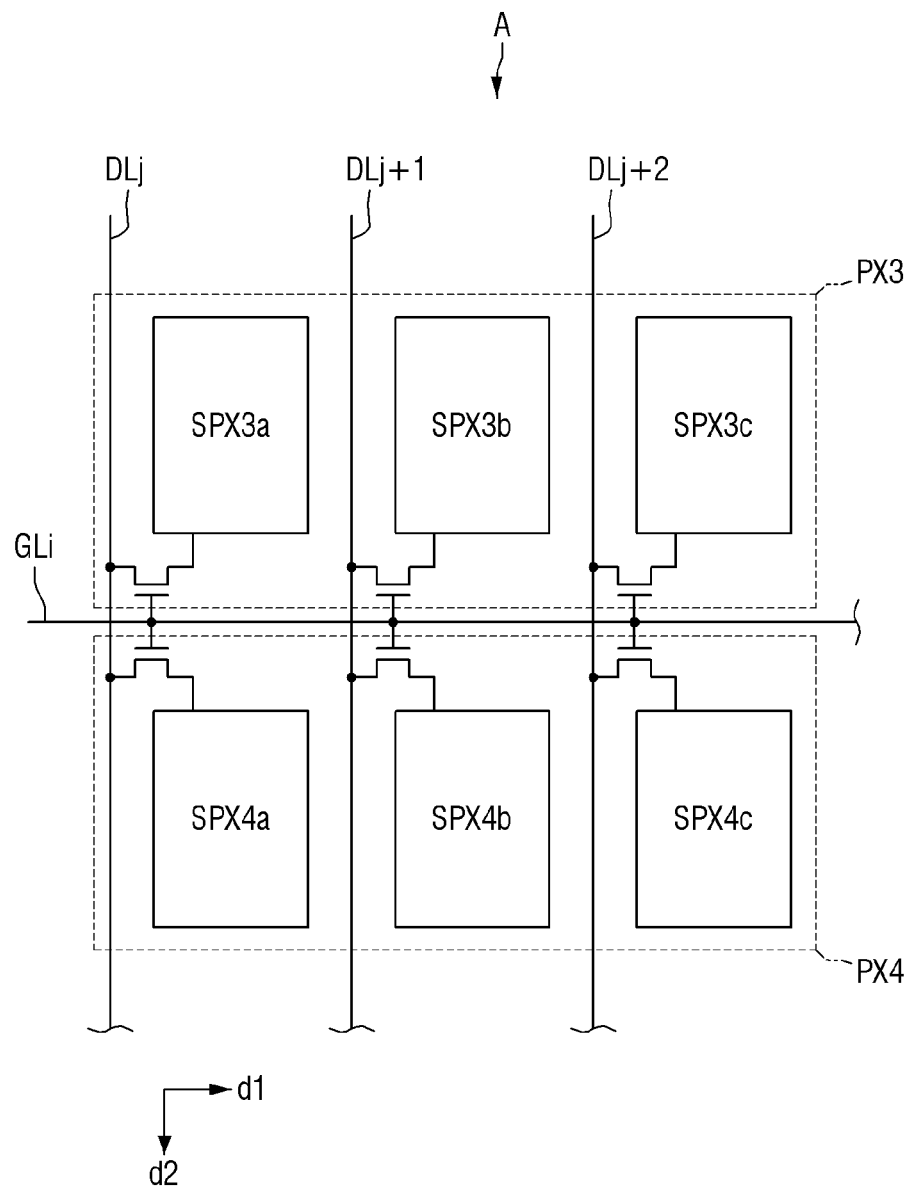
FIG. 11 is an enlarged circuit diagram of the pixel units in an area A of FIG. 10.

FIG. 9 is a schematic view illustrating an alternative exemplary embodiment of the plurality of pixel units that form the planar shape of the curved display device of FIG. 2. FIG. 10 is a schematic view showing the numbers of the pixel units in a central area and a peripheral area, respectively, of the planar shape of the curved display device of FIG. 9. FIG. 11 is an enlarged circuit diagram of the pixel units in an area A of FIG. 10.

The arrangement of the pixel units in a central area CA1 will hereinafter be described with reference to FIG. 9. In an exemplary embodiment as shown in FIG. 9, the numbers of the pixel units included in first through third columns col1 through col3, respectively, may differ from one another, but the sizes of the pixel units included in the first through third columns col1 through col3, respectively, may all be substantially the same as, or identical to, each other.

In an exemplary embodiment, the number of the pixel units may differ from one column to another column, but the size of the pixel units included in each column may be uniform. In one exemplary embodiment, for example, a horizontal length v1 of pixel units included in the first column col1, a horizontal length v2 of pixel units included in the second column col2, and a horizontal length v3 of pixel units included in the third column col3 may all be substantially the same as each other.

In such an embodiment, the number of the pixel units included in the first column col1 may be smaller than the number of the pixel units included in the second column col2, and the number of the pixel units included in the second column col2 may be smaller than the number of the pixel units included in the third column col3.

Referring to FIG. 10, the number of the pixel units included in the first column col1, which is disposed in the central area CA1, may differ from the number of the pixel units included in the second column col2, which is disposed in a peripheral area SA1. Accordingly, a horizontal length l5 of the first column col1 may be the same as a horizontal length l7 of the second column col2, but a vertical length l6 of the first column col1 may be smaller than a vertical length l8 of the second column col2.

In such an embodiment, the number of the pixel units included in each pixel may gradually increase from the central area CA1 to the peripheral area SA1 according to the curvature of the first outer side U1. Accordingly, the display surface 110 of FIG. 2 may be realized.

FIG. 9 illustrates an exemplary embodiment in which the number of pixel units increases by two between a pair of adjacent columns, but disclosure is not limited thereto. In an alternative exemplary embodiment, the amount by which the number of pixel units increases between a pair of adjacent columns may be determined according to the curvature of the first outer side U1.

Referring to the area A of FIG. 10, in a column having a relatively larger number of pixel units than a neighboring column, some pixel units may share at least one of a data line and a gate line with one another, and this will hereinafter be described with reference to FIG. 11.

Pixel units included in the area A of FIG. 10 will hereinafter be referred to as third and fourth pixel units PX3 and PX4.

The third pixel unit PX3 may include first through third sub-pixel units SPX3a through SPX3c. The fourth pixel unit PX4 may include first through third sub-pixel units SPX4a through SPX4c. In an exemplary embodiment, the first through third sub-pixel units SPX3a through SPX3c of the third pixel unit PX3 and the first through third sub-pixel units SPX4a through SPX4c of the fourth pixel unit PX4 may be connected to a same gate line. The first through third sub-pixel units SPX3a through SPX3c of the third pixel unit PX3 may share an i-th gate line GLi with the first through third sub-pixel units SPX4a through SPX4c of the fourth pixel unit PX4. In an exemplary embodiment, the first sub-pixel unit SPX3a of the third pixel unit PX3 and the first sub-pixel unit SPX4a of the fourth pixel unit PX4 may be connected to a same gate line. In such an embodiment, the first sub-pixel unit SPX3a of the third pixel unit PX3 may share a j-th data line DLj with the first sub-pixel unit SPX4a of the fourth pixel unit PX4. In such an embodiment, at least two pixel units of a column having a larger number of pixel units than a neighboring column, e.g., the pixel units in the area A, share at least one of a data line and a gate line with each other. However, the structure and manner in which pixel units in a column having a larger number of pixel units than a neighboring column share at least one of a data line and a gate line with each other are not limited to that illustrated in FIG. 11.

Figure 12:
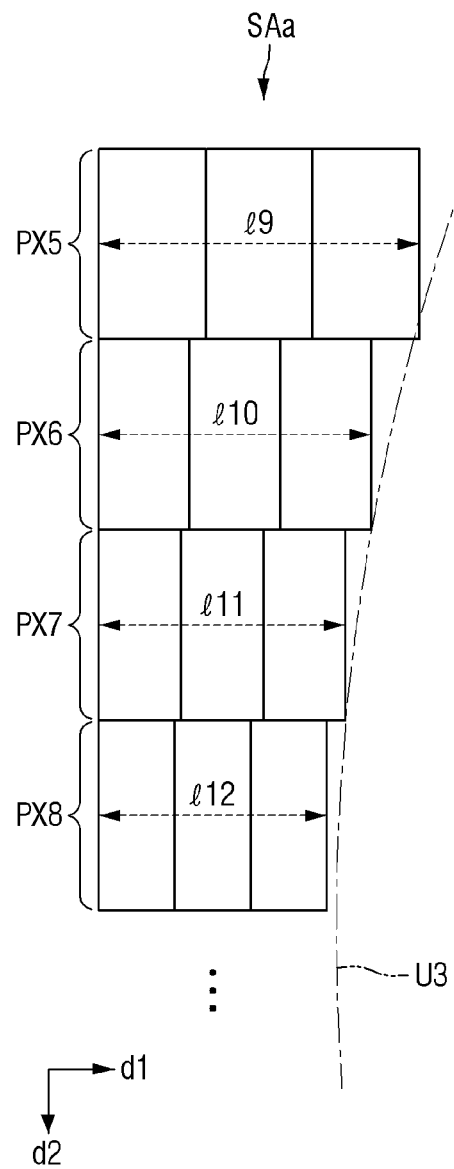
FIGS. 12 through 14 are schematic views of exemplary embodiments of the pixel units in a peripheral area of the curved display device of FIG. 2.
Figure 13:
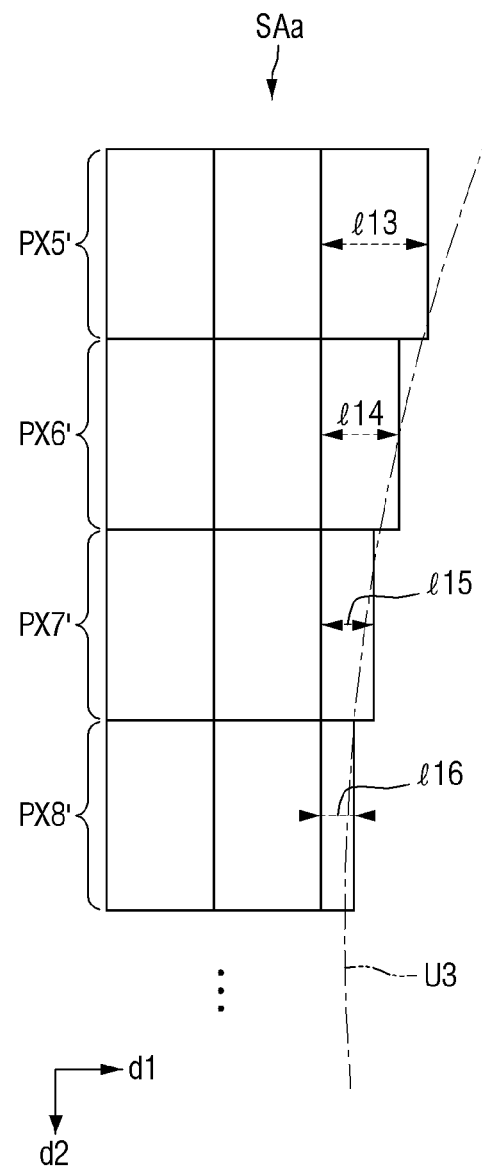
Figure 14:
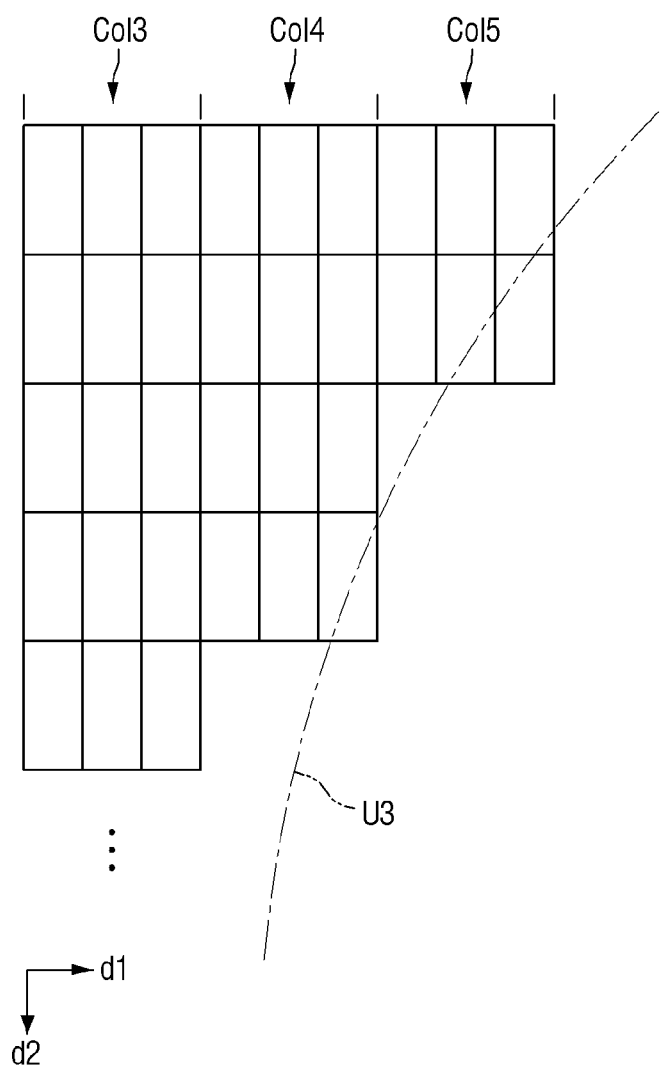

FIGS. 12 through 14 are schematic views of exemplary embodiments of the pixel units in a peripheral area of the curved display device of FIG. 2.

Referring back to FIG. 2, the third outer side U3 of the display surface 110 is concave toward the intersection between the first and second bending lines BL1 and BL2. The arrangement of a plurality of pixel units in the peripheral area SA1 to realize a third outer side U3 in a concave shape as illustrated in FIG. 2 will hereinafter be described with reference to FIGS. 12 through 14.

The arrangement of an exemplary embodiment of the pixel units in a peripheral area SA1 will hereinafter be described with reference to FIG. 12. In an exemplary embodiment, as shown in FIG. 12, the size of the pixel units in each column in a peripheral area SAa may gradually decrease along the second direction d2. In an exemplary embodiment, the size of pixel units in each column may gradually decrease at a predetermined rate. In one exemplary embodiment, for example, a horizontal length l9 of a fifth pixel unit PX5 may be larger than a horizontal length l10 of a sixth pixel unit PX6, and the horizontal length l10 of the sixth pixel unit PX6 may be larger than a horizontal length l11 of a seventh pixel unit PX7. In such an embodiment, a horizontal length l12 of an eighth pixel unit PX8 may be larger than the horizontal length l11 of the seventh pixel unit PX7. In such an embodiment, the size of the pixel units in each column in the peripheral area SAa may gradually decrease along the second direction d2 according to the radius of curvature of the third outer side U3. Although not specifically illustrated, the size of the pixel units in each column in the peripheral area SA1 may gradually increase, starting from the first bending line BL1. As a result, the display surface 110 having a third outer side U3 formed in a concave shape as illustrated in FIG. 2 may be realized.

The arrangement of an alternative exemplary embodiment of a plurality of pixel units in the peripheral area SA1 will hereinafter be described with reference to FIG. 13.

In an exemplary embodiment, as shown in FIG. 13, the size of sub-pixel units farthest to the right (in the first direction d1) of the pixel units in the peripheral area SAa may gradually decrease from a fifth pixel unit PX5' to a sixth pixel unit PX6' to a seventh pixel unit PX7' to an eighth pixel unit PX8'.

In such an embodiment, a horizontal length l13 of the sub-pixel unit farthest to the right of the fifth pixel unit PX5' may be larger than a horizontal length l14 of the sub-pixel unit farthest to the right of the sixth pixel unit PX6'. The horizontal length l14 of the sub-pixel unit farthest to the right of the sixth pixel unit PX6' may be larger than a horizontal length l15 of the sub-pixel unit farthest to the right of the seventh pixel unit PX7'. The horizontal length l15 of the sub-pixel unit farthest to the right of the seventh pixel unit PX7' may be larger than a horizontal length l16 of the sub-pixel unit farthest to the right of the eighth pixel unit PX8'. In such an embodiment, the horizontal length of pixel units may gradually decrease from the fifth pixel unit PX5' to the sixth pixel unit PX6' to the seventh pixel unit PX7' to the eighth pixel unit PX8' may gradually decrease according to the radius of curvature of the third outer side U3. Although not specifically illustrated, the size of sub-pixel units farthest to the right of pixel units in each column in the peripheral area SA1 may gradually increase, starting from the first bending line BL1. As a result, the display surface 110 having a third outer side U3 formed in a concave shape as illustrated in FIG. 2 may be realized.

The arrangement of another alternative exemplary embodiment of the pixel units in the peripheral area SA1 will hereinafter be described with reference to FIG. 14.

Referring to FIG. 14, the number of the pixel units included in each column may differ from a third column col3 to a fourth column col4 to a fifth column col5. The number of the pixel units included in each column may vary depending on at least one of the radius of curvature of the third outer side U3 and the radius of curvature of the first outer side U1. However, the amount by which the number of pixel units varies between a pair of adjacent columns is not limited to that shown in FIG. 14.

In an exemplary embodiment, the curved display device has four sides bent along the first and second bending lines BL1 and BL2, and may thus provide a heightened sense of involvement to a viewer who views the display surface 110.

Although some exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A curved display device, comprising:
    a display panel comprising a plurality of pixel units which is disposed on a display surface,
    wherein
    a first bending line, which extends in a first direction, and a second bending line, which extends in a second direction crossing the first direction at a right angle, are defined on the display surface, and the display surface is bent along the first bending line and the second bending line, wherein the display surface comprises a central area and a peripheral area disposed outside the central area, wherein the pixel units are a first column pixel unit which is disposed in the central area and a second column pixel unit which is disposed in the peripheral area, and wherein a size of the first column pixel units is smaller than a size of the second column pixel unit.

2. The curved display device of claim 1, wherein four sides of the display surface are bent along each of the first and second bending lines.

3. The curved display device of claim 1, wherein the display surface comprises:
a first outer side;
a second outer side, which is symmetrical with the first outer side with respect to the first bending line;
a third outer side, which is connected to a first end of the first outer side and a first side of the second outer side; and
a fourth outer side, which is symmetrical with the third outer side with respect to the second bending line and is connected to a second end of the first outer side and a second end of the second outer side.

4. The curved display device of claim 3, wherein at least one of the first through fourth outer sides is parabolic in a plan view.

5. The curved display device of claim 3, wherein the pixel units have different sizes corresponding to a curvature of the first outer side.

6. The curved display device of claim 5, wherein a number of the pixel units included in a first column is the same as a number of the pixel units included in a second column, which is different from the first column.

7. The curved display device of claim 5, wherein
the display surface further comprises:
a central area, in which an intersection between the first and second bending lines disposed; and
a peripheral area, which is disposed outside the central area, and
the pixel units in the central area have a smaller size than the pixel units in the peripheral area.

8. The curved display device of claim 3, wherein the pixel units have different horizontal lengths corresponding to a curvature of one of the third and fourth outer sides.

9. The curved display device of claim 3, wherein a number of the pixel units included in a first column is different from a number of the pixel units included in a second column, which is different from the first column.

10. The curved display device of claim 9, wherein
the display surface further comprises:
a central area; and
a peripheral area, which is disposed outside the central area, and
a number of the pixel units in a column in the central area is smaller than a number of the pixel units in the column in the peripheral area.

11. The curved display device of claim 10, further comprising:
data lines which provides data signals to the display panel; and
gate lines which provides gate signals to the display panel,
wherein at least two adjacent pixel units in the peripheral area are connected to a same data line of the data lines or a same gate line of the gate lines.

12. The curved display device of claim 9, wherein the pixel units have a same size as each other.

13. A curved display device, comprising:
a display panel comprising a plurality of pixels, wherein a display surface, which includes a central area and a peripheral area disposed outside the central area, is defined on the display panel;
a plurality of gate lines disposed on the display surface to extend in a first direction; and
a plurality of data lines disposed on the display surface to extend in a second direction, which crosses the first direction at a right angle,
wherein
the pixel units are connected to the gate lines and the data lines, and
a first bending line, which extends in the first direction, and a second bending line, which extends in the second direction, are defined on the display surface, and
the display surface is bent along each of the first and second bending lines.

14. The curved display device of claim 13, wherein
the pixel units include a plurality of pixel electrodes,
the size of the pixel electrodes gradually increases from the central area to the peripheral area.

15. The curved display device of claim 14, wherein
the pixel units comprises first pixel units, which are disposed in a first column, and second pixel units, which are disposed in a second column, and
a number of the first pixel units is the same as a number of the second pixel units.

16. The curved display device of claim 14, wherein
the display surface comprises:
a first outer side;
a second outer side, which is symmetrical with the first outer side with respect to the first bending line;
a third outer side, which is connected to a first end of the first outer side and a first side of the second outer side; and
a fourth outer side, which is symmetrical with the third outer side with respect to the second bending line and is connected to a second end of the first outer side and a second end of the second outer side, and
at least one of the first through fourth outer sides is parabolic in a plan view.

17. The curved display device of claim 16, wherein the pixel units have different sizes corresponding to a curvature of the first outer side.

18. The curved display device of claim 13, wherein
the pixel units comprises first pixel units, which are disposed in a first column in the central area, and second pixel units, which are disposed in a second column in the peripheral area, and
a number of the first pixel units is smaller than a number of the second pixel units.

19. The curved display device of claim 18, wherein pixel electrodes included in the first pixel units have a same size as pixel electrodes included in the second pixel units.

20. The curved display device of claim 18, wherein at least two adjacent second pixel units are connected to a same data line of the data lines or a same gate line of the gate lines.

* * * * *